United States Patent [19]

Park

[11] Patent Number: 4,664,942
[45] Date of Patent: * May 12, 1987

[54] NICKEL DIFFUSION BONDED TO METALLIZED CERAMIC BODY AND METHOD

[75] Inventor: Dong-Sil Park, Schenectady, N.Y.

[73] Assignee: General Electric Company, Schenectady, N.Y.

[*] Notice: The portion of the term of this patent subsequent to May 20, 2003 has been disclaimed.

[21] Appl. No.: 826,436

[22] Filed: Feb. 5, 1986

[51] Int. Cl.$^4$ .............................................. H05K 3/10
[52] U.S. Cl. .......................................... 427/57; 134/1; 427/96; 427/98; 427/99; 427/252; 427/253; 427/305
[58] Field of Search ................... 427/96, 98, 252, 253, 427/99, 57; 134/1

[56] References Cited

U.S. PATENT DOCUMENTS

| | | | |
|---|---|---|---|
| 3,061,463 | 10/1962 | Samuel | 427/253 |
| 4,407,860 | 10/1983 | Fleming | 427/96 |
| 4,442,137 | 4/1984 | Kumar | 427/99 |
| 4,518,624 | 5/1985 | Park et al. | 427/34 |
| 4,526,859 | 7/1985 | Christensen | 427/96 |
| 4,590,095 | 5/1986 | Park | 427/96 |

*Primary Examiner*—John D. Smith
*Attorney, Agent, or Firm*—Jane M. Binkowski; James C. Davis, Jr.; James Magee, Jr.

[57] ABSTRACT

Packless cementation is used to diffusion bond nickel to discrete exposed areas of tungsten or molybdenum that are in turn bonded to the surface of a ceramic body, e.g. in the preparation of a ceramic chip carrier or other premetallized ceramic device.

34 Claims, 9 Drawing Figures

NICKEL DIFFUSION BONDED TO METALLIZED CERAMIC BODY AND METHOD

In copending Ser. No. 740,377, entitled "NICKEL COATING DIFFUSION BONDED TO METALLIZED CERAMIC BODY AND COATING METHOD", filed June 3, 1985 now U.S. Pat. No. 4,590,095 in the name of Dong-Sil Park, assigned to the assignee hereof and incorporated herein by reference, there is disclosed the use of pack cementation to diffusion bond substantially pore-free nickel to discrete exposed areas of tungsten or molybdenum that are in turn bonded to the surface of a ceramic body.

BACKGROUND OF THE INVENTION

This invention relates to nickel metallization of a premetallized ceramic device. In one aspect, this invention relates to nickel metallization in the preparation of semiconductor packaging devices, e.g. ceramic carriers employed in the packaging of semiconductor chips.

The increased performance and circuit/bit densities of today's semiconductor chips require corresponding technological advancements in chip packaging. Since the introduction of the leadless ceramic chip carrier, the chip carrier packaging concept has seen increasing use. Ceramic chip carriers typically make use of alumina-based substrates and have discrete areas of multi-layer metallization bonded to the ceramic substrate. These areas of metallization comprise in sequence (a) a base metallization layer of tungsten or molybdenum bonded to the ceramic substrate, (b) a layer of nickel bonded to the initial, or base, layer, and (c) a layer of gold bonded to the nickel layer.

As a practical matter tungsten is the metal of choice for the base metallization although molybdenum is also used.

A single- or multi-layer ceramic substrate can be used. In the typical fabrication of multi-layer ceramic substrates, alumina powder is mixed with glass frit and organic chemicals to form a slurry. This slurry is cast into sheets having a controlled thickness, which sheets are then blanked into various sizes and shapes, and via holes are punched. These green sheets are then screen printed with tungsten (or molybdenum) to form the base metallization. These metallized green sheets are stacked, and laminated together, followed by cofiring (i.e., sintering) generally in hydrogen or a hydrogen-nitrogen mixture with the heating schedule usually peaking at 1500° C.–1650° C. A single-layer substrate would be formed in the same manner except for the stacking and laminating together of sheets. Thereafter, these sintered substrates are processed to apply nickel metallization over the exposed discrete areas of sintered tungsten or molybdenum. In the manufacture of ceramic chip carriers, this is followed in turn by gold metallization of the nickel surfaces. Actual compositions of the slurry and specifics of the processing can be expected to vary from manufacturer to manufacturer.

Generally, the tungsten or molybdenum metallization is about 10 micrometers thick and is very porous. The nickel layer applied thereto is typically 2-5 micrometers thick, this layer being applied by a electrolytic or electroless nickel plating. The nickel layer is applied to make the tungsten or molybdenum metallization receptive to soldering or brazing. The thin layer of gold typically 1-3 micrometers thick is applied to accommodate die attachment, wire bonding and sealing. For good hermeticity (and for other reasons) it is important that the nickel and the gold metallizations contain as few pores as possible.

The sintered single- or multi-layer ceramic body with the discrete area or areas of multi-layer metallization is subsequently subjected to operations such as wire bonding, chip joining and lid sealing.

In existing manufacture of a ceramic chip carrier or other premetallized ceramic device, nickel metallization is accomplished by the use of either an electrolytic or electroless plating process. A high purity nickel deposit generally can be obtained by electrolytic plating. It is well-known, however, that this process has several major drawbacks including the following: (a) because of the need for an externally applied electrical current, it is often difficult to plate articles with complex shapes and circuitry; (b) for the same reason, the nickel coating is generally very nonuniform being thicker in well-exposed areas and substantially thinner at corners, and (c) the coating tends to be quite porous.

Because of these and other disadvantages of the electrolytic mode of plating, nickel metallization of ceramic chip carriers or other premetallized ceramic device increasingly is carried out by electroless plating. This latter method can plate articles regardless of complexity of shape or circuitry with a relatively uniform coating thickness. Unlike electrolytically deposited nickel, however, electrolessly deposited nickel typically contains a high level (usually in excess of 1 wt %) of boron or phosphorus. These impurities have been associated with the introduction of high internal stress in the coatings. U.S. Pat. No. 4,407,860 (R. Fleming et al) discusses this problem and proposes a composition for the base metallization together with a postcoating treatment that purportedly provides stress-free purer nickel metallization.

Another concern in the use of electroless plating of nickel is the variability of the coating (e.g. thickness and completeness of coverage), which, in large part, is due to the extreme sensitivity of electroless nickel plating to the surface chemistry of the base metallization (tungsten or molybdenum). Still another concern is the limited selectivity of the coating, i.e., the coating often results in the deposition of nickel on the alumina substrate as well as on the tungsten. This latter problem, which is a source of electrical failure, can often be attributed to the presence of residue of a chemical, such as palladium chloride, used to activate the tungsten surface prior to applying the electroless nickel coating.

The over-all process of nickel metallization, whether by electrolytic or electroless plating, entails a great many steps. The reasons are basically as follows:

(a) A number of pre-cleaning steps (including acid and/or alkaline bath cleaning) are required, because of the sensitivity of the coating methods to the surface chemistry of tungsten, (b) in electroless plating several steps are required to activate the tungsten surface with a chemical, such as palladium chloride, and then to rinse off the excess chemical and condition the surface prior to nickel plating, (c) several more steps are required to promote adhesion of the nickel layer to the base metallization; this is often done by applying a first coating of nickel, heat-treating this coating at an elevated temperature to improve bonding to the tungsten, and then applying a second layer of nickel, and (d) a number of post-coating cleaning steps are required prior to gold plating to rinse off various chemical residues trapped in the pores and other defects in the nickel coatings.

It is, therefore, not uncommon to require 30–50 steps starting from the cofired chip carrier substrate or other premetallized ceramic device to reach the stage at which the device is ready for use or the chip carrier is ready for application of the gold plating. It would be particularly advantageous to be able to eliminate such multiple-steps, which are cumbersome and costly. It would also be advantageous to reduce the incidence of pores in the nickel coatings and have them free of boron and phosphorus content.

In one aspect, by the process of nickel metallization of this invention, it is proposed to markedly reduce the processing time and cost of the nickel metallization, while simultaneously providing a superior reproducible nickel coating free of boron and phosphorus. Packless chromizing processes are known and have been used primarily to produce chromium coatings to protect substrates, such as low carbon steel, against corrosion.

DESCRIPTION OF THE INVENTION

The present packless cementation process is a form of chemical vapor deposition. It is conducted at elevated temperature for a suitable time in the presence of a chemical activator.

Briefly stated, in one embodiment, the present process for the nickel metallization of a discrete exposed tungsten metal- or molybdenum metal-covered area bonded to a ceramic substate comprises the steps of:

(a) cleaning said ceramic substrate and metal-covered area, (b) placing said cleaned ceramic substrate and a mixture of nickel powder, powdered activator and particulate inert filler in a chamber, said substrate not being in contact with said mixture, (c) heating said chamber and its contents in an non-oxidizing environment at a temperature in the range of from about 650° C. to about 1000° C. for a period of time ranging to a maximum of about ten hours, and (d) removing said ceramic substrate from said chamber, said discrete metal-covered area having nickel diffusion-bonded thereto.

The present process in toto is much simpler than prior art processes. Specifically, in contrast to the prior art electrolytic or electroless nickel plating processes, in the process of this invention there is no need for multiple pre-cleaning steps, activation steps or post-coating sintering steps thereby obviating the cumbersome and costly procedures required in the prior art. One consequence flowing from this simplified process is the potential reduction in manufacturing cost provided thereby. Another consequence is the potential of producing a nickel coating superior to the nickel coatings obtainable from electrolytic or electroless plating processes.

Alternatively, instead of depositing the entire thickness of nickel desired by the present process, a thin layer of nickel can be applied by this process and then this layer can be brought to the desired thickness by a prior art plating method.

Although the present disclosure frequently makes reference to the base metallization layer (i.e. the layer bonded directly to the ceramic substrate) as being tungsten, this invention is equally applicable to the use of molybdenum as the base metallization layer with similar results.

In carrying out the present process there is provided a monolithic body or structure which is comprised of a single or multilayered ceramic substrate with adherent electrically conductive tungsten or molybdenum metallization wherein at least a portion of the metallization is exposed to the ambient.

In the present invention, the sintered ceramic body or substrate can be any ceramic composition which can be cofired with tungsten or molybdenum metallization. In the present process, the ceramic substrate is non-reactive with tungsten or molybdenum. Representative of useful ceramics is alumina and aluminum nitride. The ceramic usually contains a glassy phase in an amount of at least about 1% by volume, frequently ranging from about 1% by volume to about 15% by volume, and more frequently from about 4% by volume to about 10% by volume, of the ceramic body or substrate. Generally, the ceramic substrate has a porosity ranging from less than about 1% by volume to about 10% by volume, frequently from about 1% by volume to less than about 5% by volume, of the ceramic substrate.

The structure comprised of the ceramic substrate bearing the metallization of tungsten (or molybdenum) in discrete exposed area or areas should be cleaned to degrease and remove dirt in a simple process as, for example, by ultrasonic cleaning in alcohol.

The cleaned metallization-bearing ceramic substrate is placed in a chamber along with a particulate mixture of nickel powder, chemical activator and an inert filler. Typically the chemical activator is selected from the group consisting of ammonium iodide, ammonium chloride and ammonium bromide. A suitable inert filter is alumina powder. Typically, the particulate mixture has an average particle size ranging from about 2 microns to about 200 microns and is comprised of from about 1% by weight to about 50% by weight, preferably from about 5% by weight to about 20% by weight, of nickel metal powder, from about 0.1% by weight to about 10% by weight, preferably from about 0.5% by weight to about 4% by weight, of the ammonium halide powder, preferably ammonium iodide, and the balance is filler.

In the present process, the particulate mixture is used to generate nickel halide vapor which is contacted with the exposed tungsten or molybdenum metallization until the present nickel metallization or diffusion-bonded nickel is formed. The present nickel metallization or deposition occurs only on the exposed tungsten or molybdenum and not on the exposed surface of the ceramic substrate.

Using ammonium iodide as the activator, the coating chemistry can be explained briefly as follows. During heating of the metallization-bearing ceramic body and particulate mixture, ammonium iodide decomposes to generate ammonia, hydrogen iodide (HI) and some nitrogen and hydrogen. The hydrogen iodide reacts with nickel to form nickel iodide. At a higher temperature, the nickel iodide vaporizes, moves to the exposed surfaces of tungsten and deposits nickel. This deposition can occur by exchange of nickel with tungsten (Reaction 1 below), by hydrogen reduction (Reaction 2), or by thermal decomposition (Reaction 3)

$$NiI_2 + W \rightarrow Ni + WI_n \quad (1)$$

$$NiI_2 + H_2 \rightarrow Ni + HI \quad (2)$$

$$NiI_2 \rightarrow Ni + I_2/I \quad (3)$$

By its nature, the deposition of nickel by reaction (1) is selective, i.e., it occurs only on tungsten. Deposition of nickel by reaction (2) or (3) is not necessarily selective, i.e., it would be expected to occur on the alumina substrate as well as on the tungsten. Unexpectedly, nickel deposition by the process of this invention displays excellent selectivity under proper coating conditions. This apparently occurs because reactions (2) and (3) are catalyzed by the tungsten.

A benefit of the process of this invention is the in-situ cleaning effects that occur. Thus, the high temperature of the process produces substantial burnout of any residual organic materials present; in-situ generated hydrogen reduces oxides that might have been present on the surface of the articles to be coated and HI formed will exert a cleansing effect.

To retain the nickel halide vapor so that the present nickel metallization can be produced in a reasonable period of time, the present process is carried out in a chamber. The chamber can be any form of enclosure which retains the nickel halide vapor at a level which allows formation of the present nickel metallization within a reasonable period of time, preferably ranging to a maximum of about 10 hours. In one embodiment, the present process is carried out for a time period ranging to about 4 hours, in another embodiment to about 2 hours, in another embodiment to about one hour, and yet in another embodiment to about 30 minutes. In still another embodiment, the time period ranges from less than one minute or at least about one minute to about 10 hours, in another embodiment from about 2 minutes to about 2 hours, and in another embodiment from about 5 minutes to about 30 minutes.

In the chamber, the metallization-bearing substrate and particulate mixture are spaced from each other, i.e. they are not in contact. For example, the particulate mixture can be located in an open container such as, for example, a dish or cup, or it can be located as a deposit on the floor of the chamber with the ceramic substrate being spaced therefrom by, for example, being supported on a nickel screen. The location of the ceramic substrate and particulate mixture with respect to each other in the chamber can vary, but they should be located at least sufficiently close to each other so that the present nickel metallization is formed and such spacing is determinable empirically. Preferably, the particulate mixture is located as close as possible to the ceramic substrate. Also preferably, a number of metallization-bearing ceramic substrates can be placed in the chamber, for example by supporting them on spaced nickel screens, one above the other, so that the present nickel metallization can be formed on the exposed tungsten or molybdenum simultaneously or substantially simultaneously.

The chamber as well as any container used for the particulate mixture and any support used for the substrate are comprised of a material which has no significant deleterious effect on the present process or product, i.e. they are comprised of a material which is inert or substantially inert in the present process. Representative of such useful material is a metal such as, for example, nickel, molybdenum and tungsten and a ceramic such as α-alumina. Preferably, the support for the substrate is in the form of a screen.

In the present process, the particulate mixture, i.e. the mixture comprised of nickel powder, chemical activator and filler, is used in an amount and has a composition which generates sufficient nickel halide vapor to produce the present nickel metallization. The amount and composition of the particulate mixture is determinable empirically.

To accomplish the nickel metallization, the chamber and its contents are heated in a nonoxidizing environment to an elevated temperature, generally ranging from about 650° C. to about 1000° C., preferably from about 750° C. to about 900° C., for a predetermined period of time and then permitted to cool.

More specifically, the present process is carried out in an atmosphere in which the ceramic substrate, nickel and tungsten or molybdenum metal are inert or substantially inert, i.e. an atmosphere which has no significant deleterious effect thereon. Specifically, the atmosphere should be nonoxidizing with respect to nickel, tungsten and molybdenum metals. Representative of a useful atmosphere is nitrogen, hydrogen, a noble gas, preferably argon, and mixtures thereof. Preferably, the atmosphere is at about ambient or atmospheric pressure. Also, to prevent introduction of contaminants to any significant extent into the product, a flowing atmosphere preferably is used with typically a flow rate SCFH of about 0.2 to about 5.0.

Upon completion of the nickel metallization, the resulting structure is allowed to cool preferably to ambient temperature. The rate of cooling can vary and is not critical, but it should have no significant deleterious effect on the structure.

The thickness of the nickel metallization is related to the nickel halide vapor pressure and the time/temperature exposure to such vapor pressure. More specifically, the nickel halide vapor pressure depends upon such factors as the particular nickel halide and temperature, with the vapor pressure increasing with increasing temperature, as well as the extent to which the chamber is enclosed, and the amount and composition of the particulate mixture used to generate the nickel halide vapor. The nickel halide vapor is selected from the group consisting of nickel bromide, nickel chloride, nickel iodide and mixtures thereof. Nickel iodide is preferred because of its high vapor pressure at relatively low temperatures. For example, under thermal equilibrium conditions, nickel iodide has a vapor pressure of about 0.7 atmosphere at 800° C.

The resulting present nickel metallization over each of the previously exposed metallized areas of tungsten or molybdenum is of unusually high quality in that at the underside of each such nickel metallization it is well bonded (i.e. diffusion bonded) to the underlying metal. The present nickel metallization is of uniform or substantially uniform thickness, does not exhibit any noticeable edge effects or nickel aggregates to any significant extent. The nickel surface is uniformly smooth with a high degree of flatness. The present nickel metallization can be varied widely in thickness depending on the desired use of the product. Particularly important is the fact that the present nickel metallization is free of boron and phosphorus.

More specifically, on a microscopic scale, e.g., of about 10-30 magnification, the present nickel metallization is substantially or completely free of nickel aggregates and its thickness does not vary significantly at edges. This is in contrast to the nickel metallization produced by the pack cementation process of copending Ser. No. 740,377 which, on the same microscopic scale of about 10-30 magnification, always exhibits a significant number of nickel aggregates which is due to sintering of fine nickel powder in contact with the surfaces of the tungsten or molybdenum metallization. Also, on the same microscopic scale, the nickel metallization produced by pack cementation has noticeable edge effects in the form of greater Ni depositions at edges, which have been found to be related in large part to a very limited mean free path of the nickel halide vapor presumably due to the tightly packed powder mixture.

In one embodiment, the present nickel metallization is in the form of a continuous coating or layer which is substantially or completely free of porosity. The thickness of the present substantially pore-free nickel coating can be varied widely from a thickness which is at least sufficient to form a continuous coating with no significant porosity, i.e. generally at least about 2 microns, to as high a thickness as desired which for some applications is about 30 microns. Generally, for a ceramic chip carrier, the nickel coating ranges from about 2 microns to about 10 microns in thickness.

In another embodiment, the present nickel metallization is porous and can be continuous or discontinuous but such nickel metallization is present in an amount at least sufficient to provide a chemically active surface, i.e. a surface with a sufficient electrochemical potential, on which nickel can be electrolessly deposited and such electroless deposition can be carried out by conventional techniques. When the present nickel metallization is formed only to provide such chemically activated surface, it generally has a thickness ranging from a few monolayers, e.g., about 10 Angstroms, up to about $2\mu$, and more frequently from about $0.1\mu$ to about $1\mu$.

The operating conditions favoring the effective diffusion bond also promote the diffusion of metal atoms into the nickel metallization. Specifically, the present nickel metallization contains tungsten or molybdenum atoms diffused therein, usually in a significant amount. The extent of such diffusion depends largely upon the temperature/time relationship employed. Frequently, the tungsten or molybdenum atoms diffuse through the nickel layer to its surface. As a result, the tungsten or molybdenum content at the surface of the present nickel metallization or layer can range from about 0.0% by weight to about 10% by weight, preferably from about 0.0% by weight to about 5% by weight, more preferably from about 0.0% by weight to about 2% by weight, and most preferably from about 0.0% by weight to less than about 0.1% by weight of the nickel layer.

The present product is comprised of a ceramic substrate having an adherent electrically conductive tungsten or molybdenum metallization, i.e. the base metallization directly bonded to the substrate. The tungsten or molybdenum metallization can range widely in thickness, generally from about 5 microns to about 30 microns, and usually from about 10 microns to about 20 microns. The metallization of the present product which is exposed to the ambient is comprised of the base tungsten or molybdenum metallization and the present nickel metallization.

The present process produces a product which has a number of uses. The product is useful in electronic packaging. The product can be soldered or brazed via the nickel metallization to another metallic part making it useful as a socketed, or leaded device as part of a hybrid device. Also, the present metallization, after being plated with gold as is conventionally done in the production of chip carriers to prevent oxidation of the metallization, could have wires bonded thereto and seal lids soldered thereto making the product useful as a chip carrier in many commercial products such as computers. In addition, the present product can be electroless plated with nickel to produce a product which can be brazed via the metallization to another metallic part or which can be plated with gold to produce a product useful as a chip carrier.

Prior to metal, such as gold, plating of the present product, it is preferably cleaned to remove any surface contaminants which may be present by preferably a conventional process, for example by ultrasonically rinsing at room temperature in distilled water, then alcohol and drying, for example, in Freon.

BRIEF DESCRIPTION OF THE INVENTION

The features of this invention believed to be novel and unobvious over the prior art are set forth with particularity in the appended claims. The invention itself, however, as to the organization, method of operation and objects and advantages thereof, may best be understood by reference to the preceding and to the following description taken in conjunction with the accompanying drawings wherein:

Figure 1:
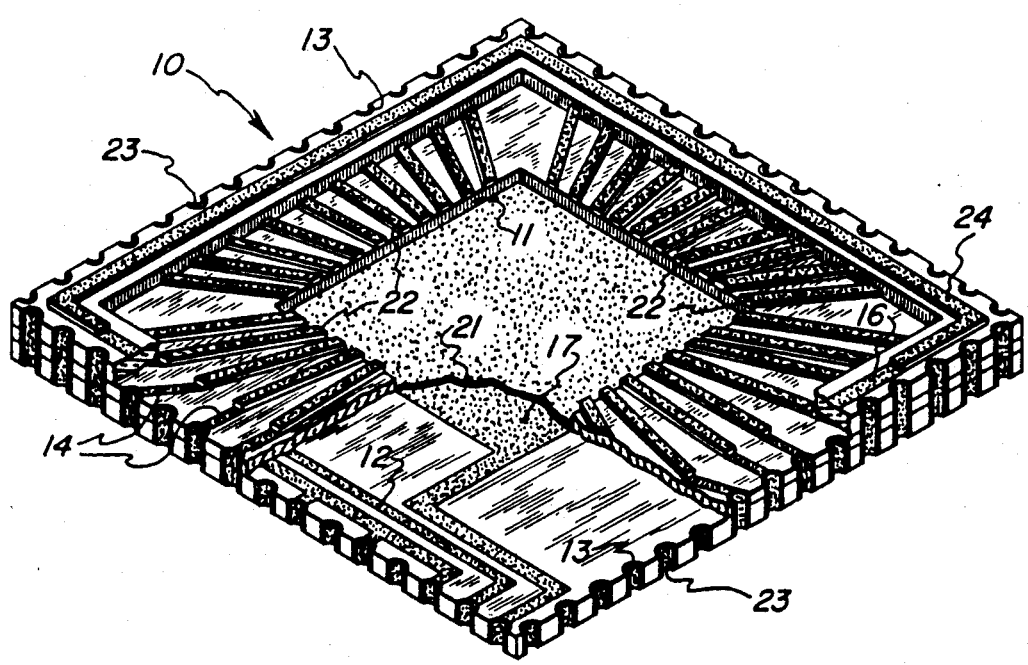
FIG. 1 is a schematic three-dimensional view of a simple multilayer ceramic chip carrier partly cut away to show the initially applied discrete areas of metallization, the exposed portion of which (after assembly and sintering of the green sheets) have each received a nickel overlay ready for the application of the subsequent layer of gold.

Referring now to the drawings, the stacked, laminated and partially metallized ceramic body 10 is an incomplete chip carrier in that the final metallization layer (i.e. the gold) has not been deposited. The semiconductor chip (not shown) to be housed in chip carrier 10 would be mounted into place in recess 11. The tungsten metallization, which is applied as areas having various configurations by, for example, screen printing to the green sheets prior to stacking and laminating remain partially exposed after the lamination. The tungsten metallization layers, such as are represented by numerals 12, 13, 14, 16, and 17 are present as discrete areas interconnected as required for the particular circuitry. The tungsten metallization resulting from the sintering step is bonded to the ceramic and usually is very porous.

The ceramic body upon completion of the present nickel metallization process is as is represented in FIG. 1, the nickel metallization layers 21, 22, 23 and 24 having been deposited and diffusion bonded to the underlying porous tungsten layers. Thus, after the present nickel metallization, each of the previously exposed areas of tungsten (and only these areas) will have received a high quality coating of nickel diffusion bonded thereto, the thickness of which is related to the nickel halide vapor pressure and the time/temperature exposure to such vapor pressure.

The invention is further illustrated by the following examples wherein the procedure was as follows unless otherwise stated:

The particulate mixture was a uniform or substantially uniform mixture.

The elemental nickel powder in the particulate mixture had an average particle size of about 2 microns.

The $NH_4I$ powder in the particulate mixture was about $-100$ mesh.

The alumina powder in the particulate mixture was on average about 50 microns in diameter.

The examples were carried out at about atmospheric pressure in flowing nitrogen maintained at about 1 SCFH.

EXAMPLE 1

Eight nominally identical ceramic chip carriers with adherent electrically conductive tungsten metallization were ultrasonically cleaned in isopropyl alcohol for one minute and dried in air. Specifically, each carrier was comprised of a multilayer ceramic substrate with at least a portion of the tungsten metallization exposed to the ambient. The ceramic substrate had a nominal composition of about 94% by weight polycrystalline alumina and the balance was a glassy phase.

Figure 2:
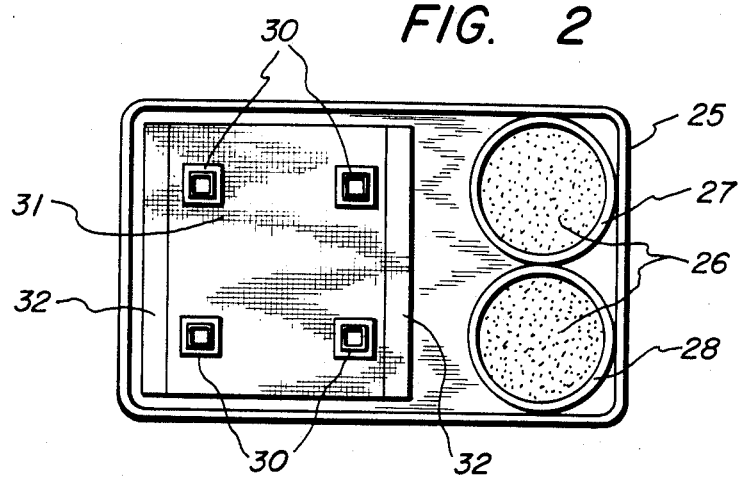
FIG. 2 is a schematic top view of an arrangement for carrying out the present process.

The cleaned carriers were then placed onto Ni screens in two layers, each layer having 4 samples in an arrangement shown in FIG. 2. The two Ni screens were separated by 0.25 inch-thick alumina spacers, and were placed inside a workboat made of Ni.

A powder mixture comprised of 20 grams nickel powder, 4 grams of $NH_4I$ and 26 grams of alumina powder was placed in equivalent amounts in two alumina crucibles, located separately from the chip carriers to be coated with Ni as shown in FIG. 2.

Specifically, FIG. 2 shows open nickel workboat 25 containing two alumina crucibles 27 and 28 wherein each crucible contains the $Ni/NH_4I/Al_2O_3$ particulate mixture 26. Chip carriers 30 are supported by nickel screen 31 which in turn is supported by alumina spacers 32.

Figure 3:
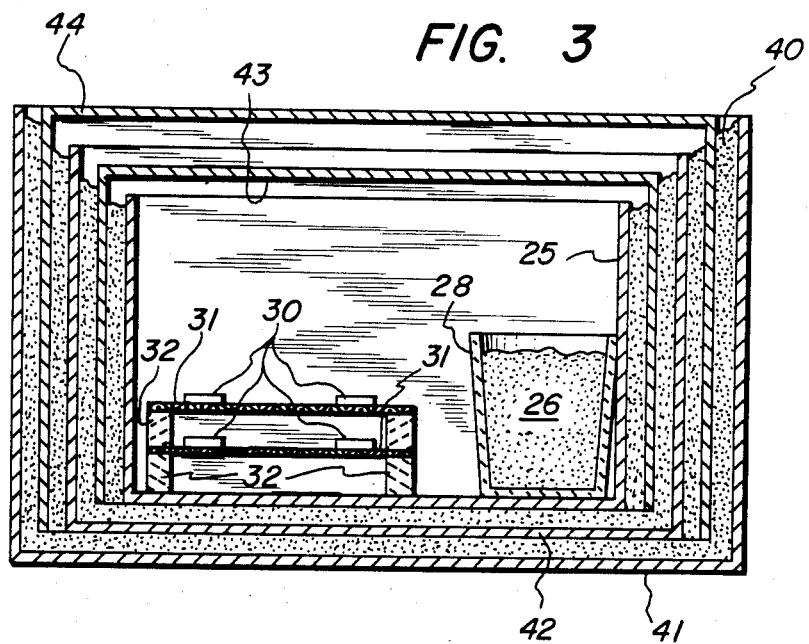
FIG. 3 is a schematic side view of the arrangement shown in FIG. 2 after it has been encased.

The workboat containing the chip carriers and the powder mixture was then covered with covers and workboats of nickel metal with the gaps filled with alumina powder, as schematically illustrated in FIG. 3. The workboat had a volume of about 400 cc.

Specifically, FIG. 3 shows nickel workboats 25, 41 and 42, nickel covers 43 and 44 wherein the gaps between the covers and workboats are filled with alumina powder 40. FIG. 3 also shows alumina spacers 32, nickel screens 31 and chip carriers 30.

The entire package was then heated to 800° C. where it was held for 30 minutes and then furnace cooled to about 80° C., and was then removed and examined.

The nickel coating obtained by this treatment was a highly selective metallization, i.e. all of the carriers showed that nickel had coated the tungsten but that it did not deposit on the substrate. The nickel coating was continuous and substantially free of pores. All of the eight chip carriers had nearly the same weight gain of 3.0 to 3.2 mg per part or 3.6 to 3.8 micron-thick Ni layer independent of their location from the particulate mixture.

Further, the coating was free of Ni aggregates, and no noticeable edge effect was observed.

Figure 7:
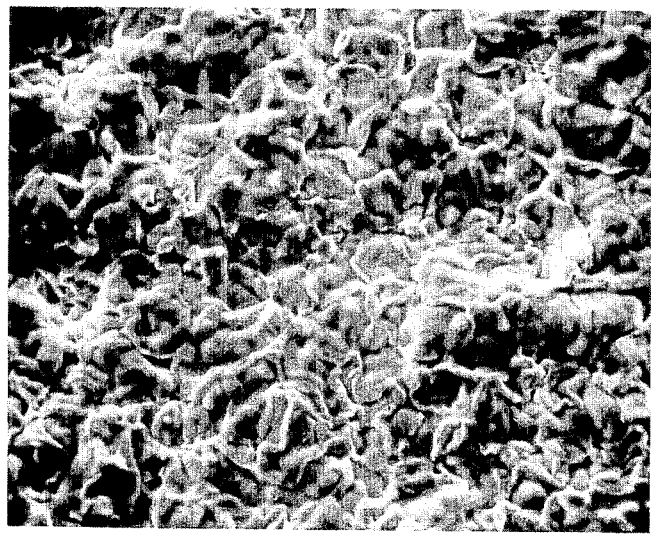
FIG. 7 is a 2000× SEM showing the surface of the nickel coating obtained using the present process.

A nickel coating produced in substantially the same manner on the same type of chip carrier as disclosed in this example is illustrated in FIG. 7.

EXAMPLE 2

120 nominally identical ceramic chip carriers with tungsten metallization were ultrasonically cleaned in Freon for 30 seconds. The chip carriers were substantially the same as those disclosed in Example 1.

Figure 4:
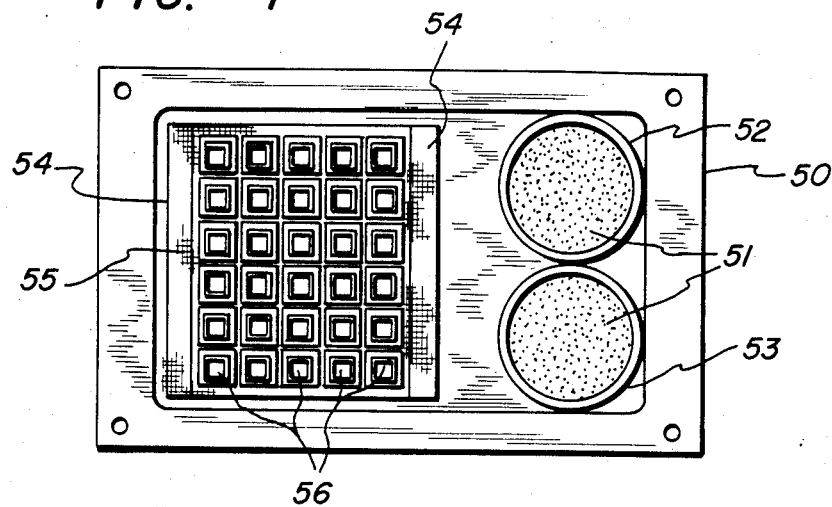
FIG. 4 is a schematic top view of an arrangement for carrying out the present process with several chip carriers.

The cleaned carriers were then placed onto Ni-wire framed Ni screens in 4 layers, each having 30 samples in an arrangement shown in FIG. 4. The 4 Ni screens were separated by 0.25 inch-thick alumina spacers, and were placed inside a workboat made of Ni.

A powder mixture comprised of 30 grams of Ni powder, 6 grams of $NH_4I$ powder and 24 grams of alumina powder was placed in equivalent amounts in two alumina crucibles, located separately from the chip carriers as shown in FIG. 4.

Specifically, FIG. 4 shows open nickel workboat 50 containing two alumina crucibles 52 and 53 wherein each crucible contains the $Ni/NH_4I/Al_2O_3$ particulate mixture 51. Chip carries 56 are supported by framed nickel screen 55 which in turn is supported by alumina spacers 54.

Figure 5:
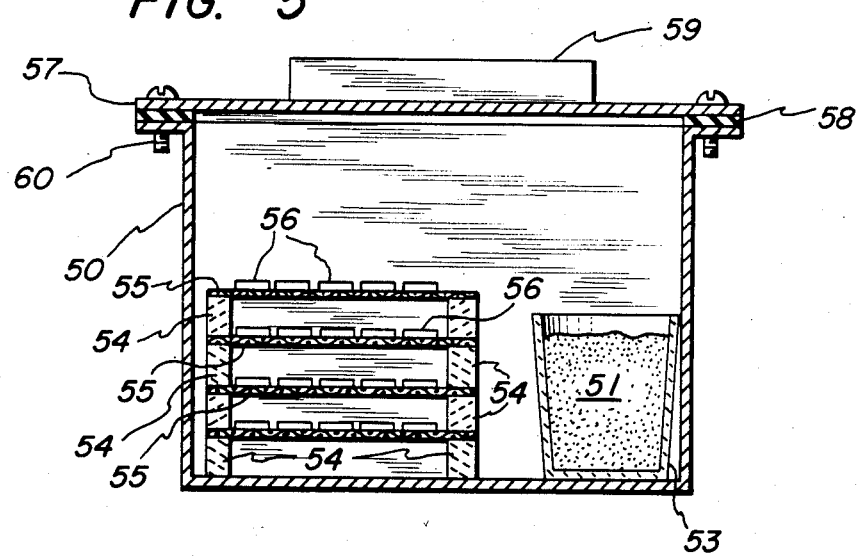
FIG. 5 is a schematic side view of the arrangement shown in FIG. 4 after it was provided with a cover.
Figure 6:
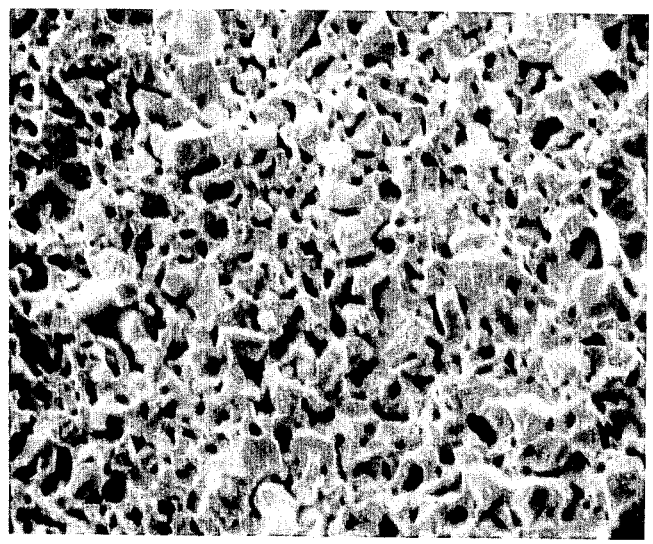
FIG. 6 is a 2000× scanning electron micrograph (SEM) showing the surface of a typical cofired porous tungsten layer prior to application of the nickel metallization.

The workboat containing the chip carriers and the particulate mixture was then covered with a Ni lid with a graphite foil gasket positioned with 4 stainless steel screws as schematically illustrated in FIG. 5. Unlike in Example 1, the arrangement in this example had only one workboat and cover, and was accordingly much simpler. The workboat had about the same volume as that of Example 1.

Specifically, FIG. 5 shows workboat 50 covered with lid 57 with gasket 58 and positioning screws 60. Weight 59 was used to maintain lid 57 in place, and to maintain a high vapor pressure of nickel iodide. FIG. 5 also shows spacers 54, screens 55 and chip carriers 56.

The entire package was then heated to 800° C. where it was held for 30 minutes and then furnace cooled to about 80° C. and was then removed and examined.

All of the carriers showed that nickel had coated the tungsten but did not deposit on the ceramic substrate. The nickel coating was continuous, highly adherent, and did not contain any significant porosity.

The nickel coating was substantially uniform. The Ni coating thickness of the 120 chip carriers was in the range of 2.9–3.1 microns independent of the spacial variations in their relative location from the particulate mixture.

The Ni metallization was free of Ni aggregates, and the edge effect was marginal.

EXAMPLE 3

A nickel-metallized chip carrier was prepared substantially as disclosed in Example 2.

The carrier was cleaned in flowing distilled water at room temperature, then subjected to ultrasonic cleaning in alcohol and then dried by immersing it in Freon. Without further preparatory treatment gold was deposited on the nickel surfaces by electroless plating yielding high quality adherent gold coatings.

This gold plating was successfully repeated with other chip carrier substrates on which nickel was deposited by the process of this invention using a variety of deposition conditions (i.e. temperature, time, particulate mixture composition, etc.).

EXAMPLE 4

10 nominally identical ceramic chip carriers with tungsten metallization were ultrasonically cleaned in Freon for 30 seconds. The chip carriers were substantially the same as those disclosed in Example 1.

The cleaned carriers were then placed onto Ni-wire screens in 2 layers, each having 2 samples in an arrangement substantially as shown in FIG. 2. The 5 Ni screens were separated by 0.25 inch-thick alumina spacers, and were placed inside a workboat made of Ni.

A particulate mixture comprised of 20 grams of Ni powder, 4 grams of $NH_4I$ and 26 grams of alumina powder was placed in equivalent amounts of two alumina crucibles, located separately from the chip carriers substantially as shown in FIG. 2. The Ni to $NH_4I$ ratio (by weight) was 5:1.

The workboat containing the chip carriers and the particulate mixture was then covered in substantially the same manner disclosed in Example 2. The workboat had a volume of 500 cc, and therefore, for every 100 cc of volume there was present 4 grams of Ni (or 0.8 gram of $NH_4I$).

The entire package was then heated to 850° C. where it was held for 10 minutes, then furnace cooled to about 80° C., and was then removed and examined.

All of the carriers showed that nickel had coated the tungsten but did not deposit on the ceramic substrate. The nickel coating was continuous, highly adherent, and had no significant porosity.

The nickel coating on all the samples was substantially uniform and had a thickness of about 5.2 microns.

The Ni coating was free of Ni aggregates, and the edge effect was marginal.

EXAMPLE 5

In this example the products were produced by pack cementation.

10 nominally identical ceramic chip carriers with tungsten metallization were ultrasonically cleaned in Freon for 30 seconds. The chip carriers were of the same type disclosed in Example 1.

The cleaned carriers were completely embedded in a particulate mixture, i.e. pack, comprised of 7 grams of nickel powder, 1.49 grams $NH_4I$ powder and 61.6 grams alumina powder contained in a cylindrical workboat made of stainless steel. The workboat had a volume of 100 cc.

A stainless steel cover was placed on the workboat, and the entire package was then heated to 850° C. where it was held for 10 minutes and then furnace cooled to about 80° C. and was then removed and examined.

The nickel coating on the tungsten metallization was relatively uniform and had a thickness of about 4.3 microns. However, it exhibited a significant number of nickel aggregates. It also had noticeable edge effects in the form of greater nickel deposition at edges.

EXAMPLE 6

Four nominally identical ceramic chip carriers with exposed adherent electrically conductive molybdenum metallization were ultrasonically cleaned in isopropyl alcohol for one minute and dried in air. Specifically, each carrier was comprised of a single-layer ceramic substrate of liquid phase sintered aluminum nitride.

The cleaned carriers were then placed onto two Ni screens substantially as shown in FIG. 2. The particulate mixture and the workboat were the same as disclosed in Example 5.

The procedure used was substantially the same as disclosed in Example 4.

All of the carriers showed that nickel had coated the molybdenum but did not deposit on the ceramic substrate. The nickel coating was continuous, highly adherent, and had no significant porosity.

The nickel coating on all the samples was substantially uniform and had a thickness of about 4.3 microns.

The Ni coating was free of Ni aggregates, and the edge effect was marginal.

EXAMPLE 7

In this example the products were produced by pack cementation.

Four nominally identical ceramic chip carriers with molybdenum metallization and aluminum nitride substrate of the same type disclosed in Example 6 were cleaned in the same manner as in Example 6.

The cleaned carriers were then subjected to the same pack cementation procedure disclosed in Example 5 using a pack of the same disclosed composition.

The nickel coating on the molybdenum metallization was relatively uniform and had a thickness of about 3.2 microns. However, it exhibited a significant number of nickel aggregates. It also had noticeable edge effects in the form of greater nickel depositions at edges.

EXAMPLE 8

The ceramic chip carriers used in this example were substantially the same as those disclosed in Example 1.

One chip carrier was used as a control, i.e., it was not preoxidized. A second chip carrier was heated in air at 350° C. for 1 hour. A third chip carrier was heated in air at 350° C. for 4 hours. The heat treatment in air oxidized the exposed surfaces of the tungsten metallization significantly.

The three chip carriers were then ultrasonically cleaned in Freon for 30 seconds and subjected to substantially the same procedure disclosed in Example 4. Specifically, the composition of the particulate mixture was the same as in Example 4 and the entire package was heated to 850° C. where it was held for 10 minutes.

All of the carriers showed that nickel had coated the tungsten but did not deposit on the ceramic substrate.

All of the nickel metallizations were adherent and substantially uniform. The thickness of the metallization was 4.0 μm on the control sample, 3.9 μm on the sample preoxidized for 1 hour, and 4.2 μm on the sample preoxidized for 4 hours. Visually, the nickel metallization on the three carriers appeared to be the same. Scanning electron micrographs of the three nickel metallizations showed them to be essentially identical.

This example demonstrates the flexibility of the present process in contrast to electroless processes where one of the major objectives of precleaning steps is to remove surface oxides.

While it is desirable to use precleaning, e.g., ultrasonic cleaning in alcohol, to get rid of material such as dust, the results of these experiments clearly demonstrate the simplicity of the precleaning requirements for nickel coating by the process of this invention compared to the cumbersome multiple cleaning steps required in electroless or electrolytic nickel plating methods.

Figure 8:
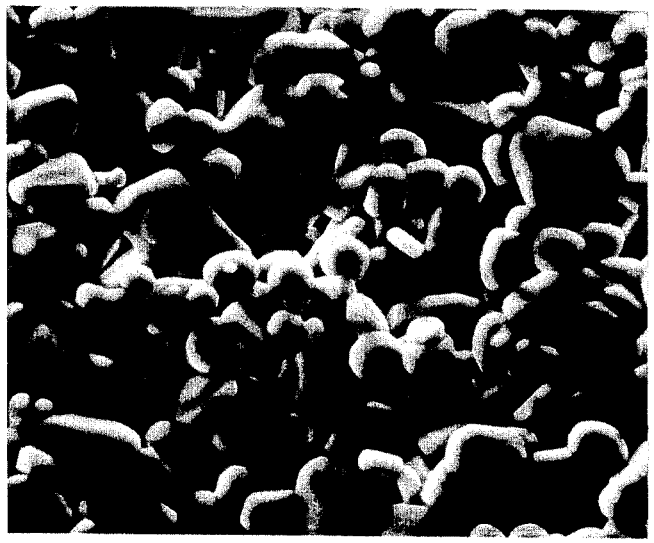
FIG. 8 is a 2000× SEM showing the exposed (i.e. unmetallized) ceramic surface of the chip carrier of FIG. 7.
Figure 9:
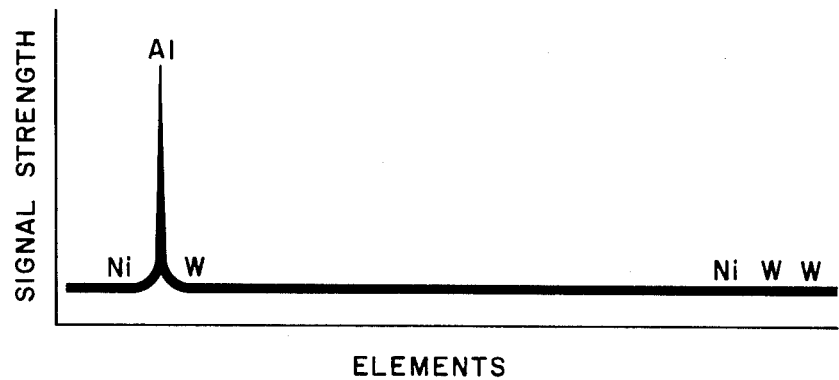
FIG. 9 is a graphic reproduction of an energy dispersive spectroscopy (EDS) scan of the surface in FIG. 8 showing that this ceramic surface remained free of nickel.

For a nickel coating method to be able to be used for chip carriers and other packaging applications, the nickel deposition should occur only on the exposed tungsten and not on the ceramic substrate. Detailed analysis has shown that the nickel coatings applied by the present packless cementation method are very selective, i.e., nickel deposition occurs only on the tungsten or molybdenum, when the coating parameters are properly controlled. This point is illustrated in FIGS. 8 and 9 in which the SEM and EDS scan, respectively, show the nickel-free alumina surface of the chip carrier sample of FIG. 7. Because of this unexpectedly excellent selectivity, in each of the foregoing examples the effective thickness of nickel layer was calculable from the weight gain of nickel and the area of the tungsten or molybdenum metallization.

In other experiments to determine the effects of certain processing variables, excellent coatings have been obtained with a wide range of these variables, e.g., for temperature (750°-950° C.), for time (1-60 minutes) and for different workboat materials (pure nickel, alumina, stainless steel). Alumina powders, NH4I powders, and nickel powders from various commercial sources have been successfully used. Also, good coatings have been obtained with NH4Cl or NH4Br as an activator even though the weight gain is lower than for NH4I. Excellent nickel coatings have also been obtained on pure tungsten foils and on pure molybdenum foils.

What is claimed is:

1. A process for the nickel metallization of a discrete exposed tungsten metal- or molybdenum metal-covered area bonded to a ceramic substrate which comprises the steps of:
   (a) cleaning said ceramic substrate and metal-covered area,
   (b) placing said cleaned ceramic substrate and a mixture of nickel powder, powdered activator and particulate inert filler in a chamber, said substrate not being in contact with said mixture,
   (c) heating said chamber and its contents in an nonoxidizing environment at a temperature in the range of from about 650° C. to about 1000° C. for a period of time ranging to a maximum of about ten hours, and
   (d) removing said ceramic substrate from said chamber, said discrete metal-covered area having a coating of nickel diffusion-bonded thereto.

2. The process of claim 1 wherein the nonoxidizing environment is argon.

3. The process of claim 1 wherein the nonoxidizing environment is nitrogen.

4. The process of claim 1 wherein the nonoxidizing environment is argon plus hydrogen.

5. The process of claim 1 wherein the nonoxidizing environment is hydrogen.

6. The process of claim 1 wherein the nonoxidizing environment is nitrogen plus hydrogen.

7. The process according to claim 1 wherein said nonoxidizing environment is at about ambient pressure.

8. The process of claim 1 wherein said discrete metal-covered area is an area of tungsten.

9. The process of claim 1 wherein said discrete metal-covered area is an area of molybdenum.

10. The process of claim 1 wherein said temperature is in the range of about 750° C. to about 900° C.

11. The process of claim 1 wherein the concentration of nickel powder ranges from about 1% by weight to about 50% by weight of said particulate mixture.

12. The process of claim 1 wherein the concentration of said activator is in the range of from about 0.1% by weight to about 10% by weight of said particulate mixture.

13. The process of claim 1 wherein said activator is selected from the group consisting of ammonium iodide, ammonium chloride and ammonium bromide.

14. The process of claim 1 wherein said activator is ammonium iodide.

15. The process of claim 1 wherein said period of time is at least about one minute.

16. The process of claim 1 wherein the particulate inert filler is alumina.

17. The process of claim 1 wherein the entire cleaning consists of ultrasonic cleaning in an organic solvent.

18. The process of claim 1 wherein the entire cleaning consists of ultrasonic cleaning in alcohol.

19. A process for the nickel metallization of a discrete exposed tungsten metal- or molybdenum metal-covered area bonded to a ceramic substrate comprises the steps of:
   (a) cleaning said ceramic substrate and metal-covered area,
   (b) placing said cleaned ceramic substrate and a mixture of nickel powder, powdered activator and particulate inert filler in a chamber, said substrate not being in contact with said mixture,
   (c) heating said chamber and its contents in an nonoxidizing environment at a temperature in the range of from about 650° C. to about 1000° C., and
   (d) removing said ceramic substrate from said chamber, said discrete metal-covered area having nickel diffusion-bonded thereto, said nickel being present in an amount at least sufficient to provide said metal-covered area with a sufficiently chemically activated surface for nickel deposition thereon by electroless deposition.

20. The process of claim 19 wherein the nonoxidizing environment is selected from the group consisting of argon, hydrogen, nitrogen and a mixture thereof.

21. The process of claim 19 wherein the nonoxidizing environment is at about ambient pressure.

22. The process of claim 19 wherein a coating of nickel is electrolessly deposited on said chemically activated surface.

23. The process of claim 19 wherein said discrete metal-covered area is an area of tungsten.

24. The process of claim 19 wherein said discrete metal-covered area is an area of molybdenum.

25. The process of claim 19 wherein said temperature is in the range of about 750° C. to about 900° C.

26. The process of claim 19 wherein the concentration of nickel powder ranges from about 1% by weight to about 50% by weight of said particulate mixture.

27. The process of claim 19 wherein the concentration of said activator is in the range of from about 0.1% by weight to about 10% weight of said particulate mixture.

28. The process of claim 19 wherein the activator is selected from the group consisting of ammonium iodide, ammonium chloride and ammonium bromide.

29. The process of claim 19 wherein the activator is ammonium iodide.

30. The process of claim 19 wherein the particulate inert filler is alumina.

31. The process of claim 19 wherein the entire cleaning consists of ultrasonic cleaning in an organic solvent.

32. The process of claim 19 wherein the entire cleaning consists of ultrasonic cleaning in alcohol.

33. A process for the nickel metallization of exposed tungsten or molybdenum metallization on a ceramic substrate which comprises the steps of:
   (a) placing said tungsten or molybdenum metallization-bearing ceramic substrate and a mixture of nickel powder, powdered activator and particulate inert filler in a chamber, said metallization-bearing substrate not being in contact with said mixture, and
   (b) heating said chamber and its contents in an nonoxidizing environment at a temperature in the range of from about 650° C. to about 1000° C. for a period of time sufficient to form a substantially pore-free coating of nickel diffusion-bonded to said tungsten or molybdenum metallization.

34. A process for diffusion bonding nickel to exposed tungsten or molybdenum metallization on a ceramic substrate which comprises the steps of:
   (a) placing said tungsten or molybdenum metallization-bearing ceramic substrate and a mixture of nickel powder, powdered activator and particulate inert filler in a chamber, said metallization-bearing substrate not being in contact with said mixture, and
   (b) heating said chamber and its contents in an nonoxidizing environment at a temperature in the range from about 650° C. to about 1000° C. for a period of time sufficient to diffusion bond nickel to said tungsten or molybdenum metallization in an amount at least sufficient to make the resulting metallization sufficiently chemically activated for the electroless deposition of nickel thereon.

* * * * *